United States Patent [19]
Shin et al.

[11] Patent Number: 5,434,097
[45] Date of Patent: Jul. 18, 1995

[54] METHOD FOR MANUFACTURING AN IMAGE SENSOR

[75] Inventors: Jong-cheol Shin; Heung-kwun Oh, both of Kyungki, Rep. of Korea

[73] Assignee: Samsung Electronics Co., Ltd., Suwon, Rep. of Korea

[21] Appl. No.: 183,428

[22] Filed: Jan. 19, 1994

Related U.S. Application Data

[63] Continuation of Ser. No. 59,330, May 11, 1993, Pat. No. 5,334,867.

[30] Foreign Application Priority Data

May 11, 1992 [KR] Rep. of Korea .................. 92-7950

[51] Int. Cl.$^6$ ................................ H01L 21/339
[52] U.S. Cl. ............................... 437/53; 437/978; 148/DIG. 114
[58] Field of Search ................ 437/50, 53, 920, 978; 148/DIG. 114, DIG. 156

[56] References Cited

U.S. PATENT DOCUMENTS 5,238,863  8/1993  Fukusho et al. ................ 437/53

FOREIGN PATENT DOCUMENTS 0002684  1/1979  Japan ........................ 437/53

OTHER PUBLICATIONS

W. H. Kent, "Charge Distribution in Buried-Channel Charge-Coupled Devices", The Bell System Technical Journal, vol. 52, No. 6, Jul.–Aug., 1973, pp. 1009–1025.

John W. Chen, "Barrier Lowering in Short-Channel CCD's", IEEE Transactions on Electron Devices, vol. Ed-29, No. 10, Oct., 1982, pp. 1588–1593.

Wolf et al., "Silicon Processing for the VLSI Era, vol. 1: Process Technology", 1986, pp. 534 and 556.

*Primary Examiner*—Chandra Chaudhari
*Attorney, Agent, or Firm*—Charles R. Donohoe; Robert A. Westerlund, Jr.; Stephen R. Whitt

[57] ABSTRACT

A charge-coupled device (CCD) is provided having improved charge transfer efficiency. This CCD is a portion of an image sensor and manufactured by first laminating a first oxidation film and a first nitride film one after the other on a semiconductor substrate and then forming a plurality of first gate electrodes on the first nitride film at predetermined intervals apart. A second oxidation film is formed only on an upper surface and along side walls of each of the first gate electrodes. The first nitride film exposed between the first gate electrodes is removed and a second nitride film is formed on the exposed first oxidation film and the second oxidation film. A second gate electrode is then formed on the second nitride film between adjacent first gate electrodes. An image sensor is obtained in which leakage current density between the gate electrodes is reduced and the dielectric characteristic of a gate dielectric film is improved.

9 Claims, 2 Drawing Sheets

METHOD FOR MANUFACTURING AN IMAGE SENSOR

This is a division of application Ser. No. 08/059,330 now U.S. Pat. No. 5,334,867, filed May 11, 1993.

BACKGROUND OF THE INVENTION

1. Field of the Invention

The present invention relates to a solid stage image sensor of a charge-coupled device (CCD) type and its manufacturing method. More particularly, the present invention relates to a charge-coupled device and its manufacturing method in which device characteristics are improved so that excellent charge transfer efficiency can be maintained.

2. Description of the Related Art

As is well-known, a solidification of image sensors having a matrix type arrangement was first proposed in the early 1960's. However, solidification techniques have failed to materialize.

In the early 1970's, as large scale integrated circuit (LSI) technology took form in connection with metal oxide semiconductor (MOS) devices, a bucket brigade device (BBD) and a CCD were soon available as charge transfer devices (CTDs). From that time on, continued research in the field of solid state image sensors has remained active.

Generally, the structure of a CCD is simple. A plurality of MOS diodes are formed in uniform arrangement along the surface of a semiconductor substrate. When an inverting voltage is applied to a MOS diode, two states are obtained. A non-equilibrium state enlarges the deep depletion region beneath the surface of the semiconductor substrate. An equilibrium state is also obtained at which time minority carriers accumulate. When these two states are assigned digital logic levels of "0" and "1," respectively, a device having operating properties is realized. Hence, when a number of minority carriers are sequentially transferred from the non-equilibrium state to the equilibrium state, the result is a potential analog signal effect. Consequently, the above described two states make possible wide application of solid state image sensor type technologies.

In a solid state image sensor, the operations of photo-electrically converting, accumulating, scanning, and reading-out of such electric charges is realized on a single chip. Among the different solid state image sensors, the CCD type finds wide utility because it exhibits good electrical and structural characteristics.

The CCD type solid state image sensor has a photo sensing portion which includes either a PN junction photodiode or a MOS capacitor. The image sensor also has both a transfer portion, which includes a CCD shift register, and an output circuit portion.

When light is input to the photo sensing portion, photo energy is converted into an electrical charge to be accumulated and then sent to the transfer portion during a field shift. In turn, charges are accumulated in the corresponding transfer portion. When transfer pulses are sequentially applied to transfer gate electrodes, the charges are sequentially transferred to regions below adjacent electrodes. A sequential charge transfer is a function of the depth of depletion layers beneath the surface of the semiconductor substrate. In response to a series of transfer pulse voltages, signals introduced as charges at transfer portion regions are shifted to regions below adjacent electrodes until finally transferred to the output circuit portion.

As described above, the structure of a CCD having a transfer portion is very simple. However, because information is represented by a quantity of electric charges transferred within the body of the semiconductor substrate, completeness and accuracy of charge transfer becomes an important factor.

Transfer efficiency, defined as the ratio between an initial charge and a transferred charge, is an important parameter for determining a charge transfer characteristic of a particular CCD. A buried channel CCD (BCCD), in which a channel is formed in the bulk semiconductor just beneath the semiconductor surface, has been used to improve a CCD's transfer efficiency since first introduced (see, H. W. Kentin Bell, Syst. Tech. J. 52, 1009, 1973). However, because a long minority carrier travel time across the transfer portion degrades electric field intensity between adjacent electrodes, a different CCD electrode structure is necessary capable of reducing minority carrier travel time.

Experimental results on the influence of gate electrode length on charge transfer efficiency is discussed in an article by John Y. Chen and C. R. Viswanathan, "Barrier lowering in short-channel CCD's," IEEE Trans. Electron Device, ED-29, 1588, 1982. Such overlap-gate CCD structures have become common. An overlap-gate CCD structure reduces the electrode length and yields high density of integration. The manufacturing method of a conventional overlap-gate CCD is illustrated in prior art FIGS. 1 through 4.

First, as shown in FIG. 1, oxidation film 12 and silicon nitride film 13 are sequentially laminated on a semiconductor substrate 11 to provide a dielectric layer of a transfer gate electrode. In turn, after a polycrystal silicon layer is formed thereon, conventional photolithography and etching processes are used to form first transfer gate electrodes 14.

Subsequently, as shown in FIG. 2, when the remaining polysilicon layer constituting first transfer gate electrodes 14 is thermally oxidated, insulation oxidation film 15 is formed to a constant thickness over the surface and along the side walls of first transfer gate electrodes 14. At this time, formation of insulation oxidation film 15 results in a characteristic oxidation film growth speed difference between silicon nitride film 13 and the remaining polysilicon layer constituting the first transfer gate electrodes 14.

The thermal oxidation method is certainly a desired insulation oxidation film formation method. However, it has a drawback in that this method yields a structurally weak portion (portion 1A of FIG. 2) that provides an insufficient insulation characteristic.

As shown in FIG. 3, after a second polysilicon layer is formed over the overall surface of an upper portion of the substrate, a polysilicon layer having a wing-shaped pattern results. Using a conventional photolithography and etching process, portions of the second polycrystal silicon layer are formed to overlap adjacent first transfer gate electrodes 14, thus forming second transfer gate electrodes 16.

In FIG. 4, a partial cross-sectional view of enlarged portion 1A, described above as a structurally weak portion in FIG. 2, is shown in closer detail. The conventional overlap-gate structure of FIGS. 1 to 4 is simple to manufacture and results in a highly integrated gate electrode structure having short electrode lengths.

However, such a conventional CCD contains the following drawbacks.

First, when insulation oxidation film 15 is formed using a thermal oxidation process, the growth speed of the oxidation film 15 is materially reduced as a result of inherent material property characteristics of silicon nitride film 13. Consequently, edge portion 1A of each first transfer gate electrode 14 disposed adjacent to silicon nitride film 13 is too structurally weak to protect against direct leakage currents generated by, for example, a pinhole. This is because insulation oxidation film 15, between first and second transfer gate electrodes 14 and 16, is too thin.

Secondly, when the first polycrystal silicon layer is processed by a photolithography and etching process to form first transfer gate electrodes 14, portions of silicon nitride film 13 along lower portions of second transfer gate electrode 16, become over-etched. The result is a thickness difference along the lateral surface width of silicon nitride film 13 which is made particularly thin along these over-etched portions.

In turn, a difference in dielectric capacitance exits due to the difference in thickness between first and second transfer gate electrodes 14 and 16 with semiconductor substrate 11. This difference in dielectric capacitance scatters linearity due to an asymmetry of electric charge transfer below respective gate electrodes as well as changes a potential well structure below respective gate electrodes. As a result, device characteristics such as, for example, CCD transfer efficiency are degraded.

Thirdly, the surface of silicon nitride film 13 that is exposed between first transfer gate electrodes 14 is damaged and polluted during a dry etching process (performed when first transfer gate electrodes 14 are formed), as well as during a subsequent thermal oxidation process. As a result, the dielectric characteristics of second transfer gate electrodes 16 are significantly degraded.

SUMMARY OF THE INVENTION

Therefore, to solve the above problems, it is an object of the present invention to provide a semiconductor device and its manufacturing method in which an insulation characteristic between gate electrodes formed on a semiconductor substrate and a dielectric characteristic between the semiconductor substrate and each of the gate electrode are improved.

To accomplish the above object of the present invention, there is provided a semiconductor device which includes a semiconductor substrate in which a first oxidation film and a first nitride film are laminated one after the other on the surface of the substrate. A plurality of first gate electrodes are then arranged on the first nitride film formed spaced at predetermined intervals apart. A plurality of separately formed second gate electrodes are then provided and separated, by an insulation film, with adjacent first gate electrodes.

The resultant structure of the insulation film, which separates the first gate electrodes and the second gate electrodes, includes a second oxidation film which is in contact with each of the first gate electrodes and a second nitride film which is in contact with each of the second gate electrodes.

To accomplish the second object of the present invention, there is provided a method for manufacturing a semiconductor device comprising the steps of laminating on a semiconductor substrate a first oxidation film and a first nitride film one after the other, forming a plurality of first gate electrodes and arranged on the first nitride film at a predetermined distance apart, forming a second oxidation film only on the upper surface and side walls of each of the first gate electrodes, removing any exposed portions of the first nitride film between the first gate electrodes to expose the first oxidation film, forming a second nitride film on the exposed first oxidation film and the second oxidation film, forming a plurality of second gate electrodes on the second nitride film, each extending between adjacent ones of said first gate electrodes.

Accordingly, a semiconductor device formed as in the present invention, and having the above described properties, will provide a greatly improved insulation characteristic between gate electrodes, as well as provide a more reliable gate dielectric film.

The present invention can be better understood through the detailed description of the embodiment and the claims which are described with reference to the accompanying drawings.

BRIEF DESCRIPTION OF THE DRAWINGS

The above object and other advantages of the present invention will become more apparent by describing in detail a preferred embodiment of the present invention with reference to the attached drawings in which.

DETAILED DESCRIPTION OF THE PREFERRED EMBODIMENTS

The present invention relates to an image sensor CCD structure which includes an electric charge transfer portion and which will be described below in detail with reference to the accompanying FIGS. 5 through 8.

Figure 5:
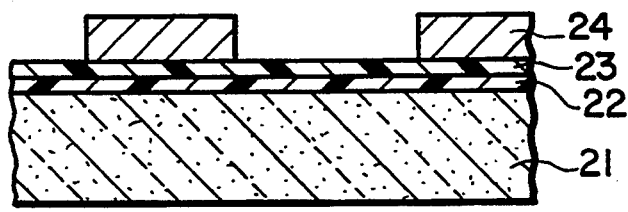
FIGS. 5 through 8 are cross-sectional views to show the formation process of a transfer gate electrode structure for an image sensor according to the present invention.

In FIG. 5, first oxidation film 22 and a first nitride film 23 are laminated one after the other on a semiconductor substrate 21. Thereafter, a conductive material is coated and formed on the overall surface and a plurality of first gate electrodes 24 are formed by way of a conventional photolithographic etching technology.

In FIG. 5, semiconductor substrate 21 is mainly composed of a silicon material whose conductivity may be either P-type or N-type. In a BCCD structure, a channel region (formed in the semiconductor substrate in response to an applied voltage at respective gate electrodes) is selectively formed at a predetermined depth from the surface. In a BCCD type structure having improved transfer efficiency of generated electric charges, an opposite conductivity well structure can be selectively provided just below a surface of the semiconductor substrate. When, for example, a CCD is provided with 2-phase operation, an impurity concentration below the surface of alternatively disposed gate electrodes can be changed so that an electric charge transfer direction is established.

As shown in FIG. 5, first oxidation film 22, conventionally a silicon oxidation film having a thickness of 10–2,000Å, and first nitride film 23, conventionally a silicon nitride film having a thickness of 60–2,000Å, are first deposited by way of a chemical vapor deposition (CVD) method or a plasma enhanced chemical vapor deposition (PECVD) method.

Subsequently, in order to form a plurality of first gate electrodes 24, a polycrystal silicon layer is formed on first nitride film 23. Thereafter, an etching process is performed by way of a general dry etch method until first nitride film 23 is exposed. In this way, a plurality of first gate electrodes 24 are formed in a predetermined arrangement spaced at predetermined intervals apart.

Electrode length can be adjusted in accordance with a selected etch pattern so as to optimize transfer efficiency of electric charges. During the dry-etching process, there is a high probability that first nitride film 23 will either be partially etched and become thinner, or that it will be polluted by, for example, surface damage or impurities both of which are undesirable consequences of the dry etching process.

Figure 6:
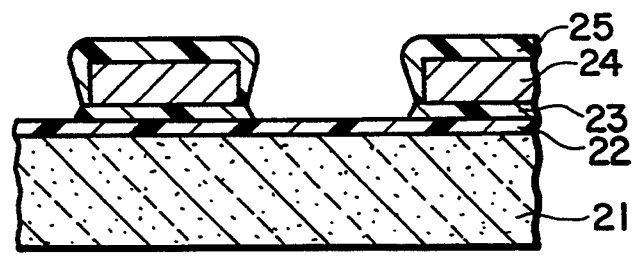

As shown in FIG. 6, second oxidation film 25 is formed along an upper surface and along side walls of each of first gate electrodes 24 to a predetermined thickness. Second oxidation film 25 is a thermal oxidation film formed by a thermal oxidation process. Because first nitride film 23 functions as an oxidation-preventive film, second oxidation film 25 grows only along an upper surface and along side walls of each of first gate electrodes 24. Along lower portion of the side walls of each of first gate electrodes 24, the silicon oxidation film 25 grows slowly, thereby creating a structurally weak portion with a degraded insulating strength.

First nitride film 23 which was partially-etched and polluted by the dry-etch used to remove portions of the polysilicon crystal layer is subsequently removed by a wet etching process using a phosphoric acid having a high etch selection ratio relative to first nitride film 23.

Alternatively, the removal of first nitride film 23 may be performed by partially dry-etching first silicon nitride film 23 and then wet etching the remaining portion thereof in order to prevent over-etching portions of silicon nitride film 23 extending below first transfer gate electrodes 24. The partial dry etching of the silicon nitride film 23 is different from the above-described step of dry-etching the polysilicon crystal layer for the purpose of originally forming first transfer gate electrodes 24. Since a wet-etch is performed after the partial dry-etching of the first nitride film 23 (preferably about half the thickness of the first nitride film layer is dry-etched), oxide layer 22 is not subject to the detrimental effects of a dry-etch thereon.

After the step of forming thermal oxidation film 25 and prior to the step of wet-etching first nitride film 23, an HF cleaning solution is used to remove a thin-film oxide layer which forms on the exposed portions of the first nitride film 23. The use of the HF cleaning solution is, however, unnecessary in the alternative situation described above where a second dry-etch step is provided to initially partially etch the first nitride film 23.

Figure 7:
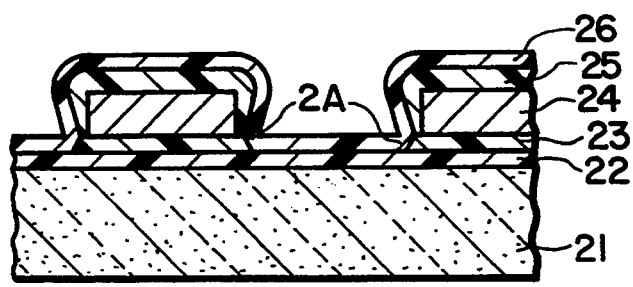

In turn, as shown in FIG. 7, second nitride film 26 is deposited on the overall surfaces of the resultant product shown in FIG. 6. However, prior to depositing second nitride film 26, a boiling sulfuric acid solution is used to clean the resultant surface.

Second nitride film 26 is a conventional silicon nitride film and is deposited by the CVD method or the PECVD method such that deposition thickness will be the same as that of the first nitride film 23 disposed substantially under each of first gate electrodes 24.

To vary the electric charge transfer direction of the resultant device (e.g., 2-phase CCD), the second nitride film 26 is deposited thicker than the first nitride film 23. The former may alternatively also be formed to be thinner than the latter.

Figure 1:
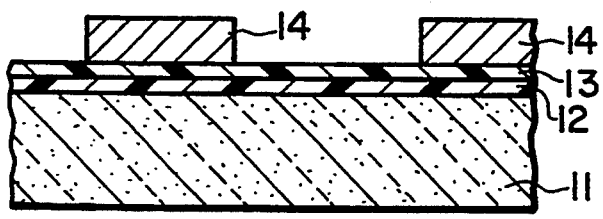
FIGS. 1 through 3 are cross-sectional views to show a formation process of a transfer gate electrode for a conventional image sensor.
Figure 2:
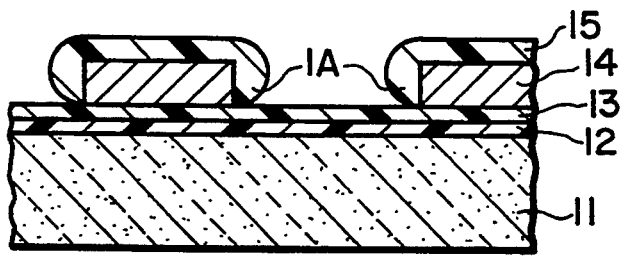
Figure 3:
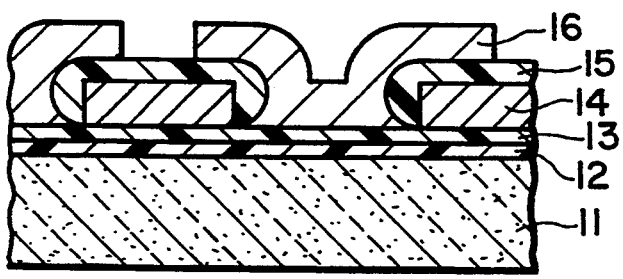
Figure 4:
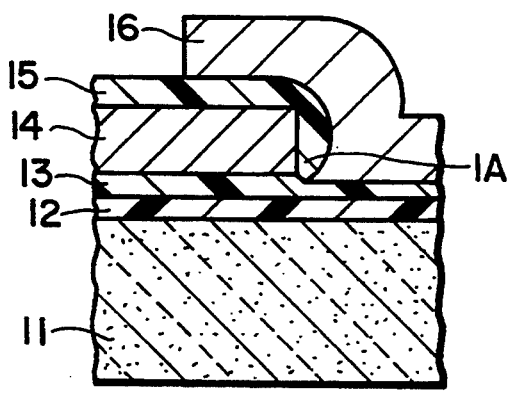
FIG. 4 is a partially enlarged cross-sectional view to show a structurally weak portion of the image sensor manufactured by the process shown in FIGS. 1 to 3.

Furthermore, second nitride film 26 is deposited to a sufficient thickness along weak portion 2A where the growth of second oxidation film 25 is incomplete (near the lower portion of the side wall in each of first gate electrodes 24), so as to provide a side-wall area whose surface gradation is substantially less pronounced than that provided by the resultant device shown in FIGS. 3 and 4. Accordingly, a subsequent deposition process is easily performed and the insulation characteristic is reinforced as well.

Figure 8:
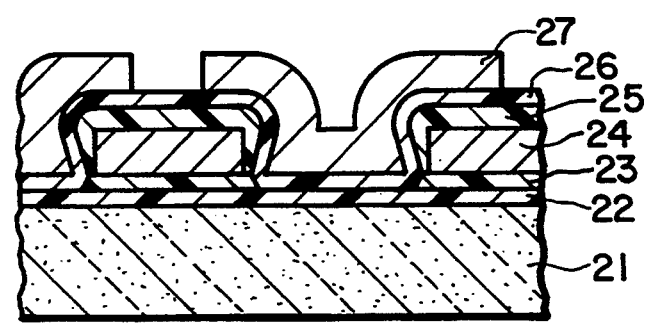

With regard to FIG. 8, a conductive material is deposited on second nitride film 26 to form second gate electrodes 27. A polycrystal silicon is generally used as the above conductive material. The polycrystal silicon is patterned so as to overlap portions between adjacently disposed first gate electrodes 24. This is desirable in view of a CCD device's operating characteristic. Alternatively, the polycrystal silicon may be formed so as not to overlap adjacently disposed first gate electrodes 24 at all or, further yet, formed so as to overlap only one of adjacently disposed first gate electrodes 24.

As described above, the semiconductor device according to the present invention reduces leakage current density, which is generally a serious problem with conventional semiconductor devices provided with only a thermal oxidation film (an insulation film) between first gate electrode and an adjacent second gate electrode.

In the present invention, a non-polluted second nitride film, rather than a first nitride film, is provided along a lower portion of each second gate electrode and used as the dielectric film. Accordingly, the dielectric characteristic of the device of the present invention is significantly improved, thereby preventing unwanted or radical charge transfers in the semiconductor substrate, and greatly improving reliability.

Using the manufacturing method of the semiconductor device according to the present invention, a semiconductor device having the improved characteristic described above may be easily manufactured. Because the length of the gate electrode and the thickness of the dielectric film is easily adjusted during manufacture, the electrical and physical properties of the device can also be improved. Furthermore, manufacturing yield is increased.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. A method for manufacturing an image sensor, comprising the steps of:
    laminating on a semiconductor substrate a first oxidation film and a first nitride film one after the other;
    forming a plurality of first gate electrodes on said first nitride film at spaced apart intervals, leaving portions of said first nitride film exposed between said first gate electrodes;

forming a second oxidation film on an upper surface and along side walls of each of said first gate electrodes;

removing said exposed portions of said first nitride film, thereby exposing portions of said first oxidation film;

forming a second nitride film on said exposed first oxidation film and on said second oxidation film formed on said first gate electrodes such that covered adjacent first gate electrodes are formed; and forming a plurality of second gate electrodes on said second nitride film between said covered adjacent first gate electrodes.

2. A method for manufacturing an image sensor according to claim 1, wherein said second oxidation film is formed by a thermal oxidation process.

3. A method for manufacturing an image sensor according to claim 1, wherein the step of removing said first nitride film is performed by a wet etching process.

4. A method for manufacturing an image sensor according to claim 3, wherein prior to the step of removing said first nitride film by said wet etching process, an upper portion of said first nitride film is removed by a dry etching process.

5. A method for manufacturing an image sensor according to claim 3, wherein an etching liquid of said wet etching process has a higher etching selection ratio with regard to said first nitride film relative to said second oxidation film.

6. A method for manufacturing an image sensor according to claim 5, wherein the etching liquid of said wet etching process is a phosphoric acid.

7. A method for manufacturing an image sensor according to claim 1, wherein a thickness of said second nitride film is selectively adjusted reinforce an effective oxide thickness of a lower portion of each of said second gate electrodes.

8. A method for manufacturing an image sensor according to claim 7, wherein said second nitride film is formed so that a thickness of said second nitride film is the same as that of said first nitride film.

9. A method for manufacturing an image sensor according to claim 1, wherein a thickness of said first nitride film is in the range of about 60 to 2,000Å.

* * * * *